United States Patent [19]

Comer

[11] 4,118,699

[45] Oct. 3, 1978

[54] DIGITAL TO ANALOG CONVERTER WITH BINARY AND BINARY CODED DECIMAL MODES

[75] Inventor: Donald T. Comer, Los Gatos, Calif.

[73] Assignee: Precision Monolithics, Inc., Santa Clara, Calif.

[21] Appl. No.: 768,326

[22] Filed: Feb. 14, 1977

[51] Int. Cl.² .............................................. H03K 13/05
[52] U.S. Cl. ............................................. 340/347 DA
[58] Field of Search ..................... 340/347 M, 347 DA

[56] References Cited

U.S. PATENT DOCUMENTS

| Re. 28,633 | 11/1975 | Pastoriza | 340/347 DA |
| 3,019,426 | 1/1962 | Gilbert | 340/347 DA |

OTHER PUBLICATIONS

Henry "EDN", Aug. 5, 1973, pp. 70-73, V18N15.

*Primary Examiner*—Charles D. Miller

[57] ABSTRACT

A digital to analog converter with bit circuits arranged in binary order, in which a supplemental current circuit is added to selected bit circuits to enable convenient and efficient conversion from binary to BCD operation. Supplemental BCD currents are controlled by a bias circuit which automatically increases the BCD bit circuit bias to a level at which the full-scale BCD output current is substantially equal to the full-scale binary output current.

27 Claims, 6 Drawing Figures

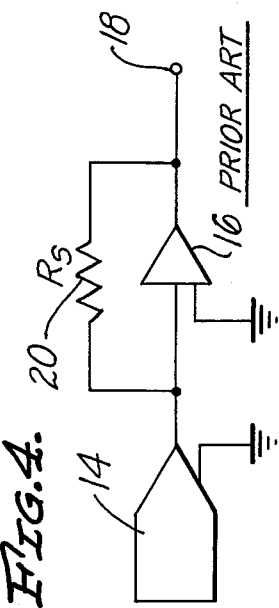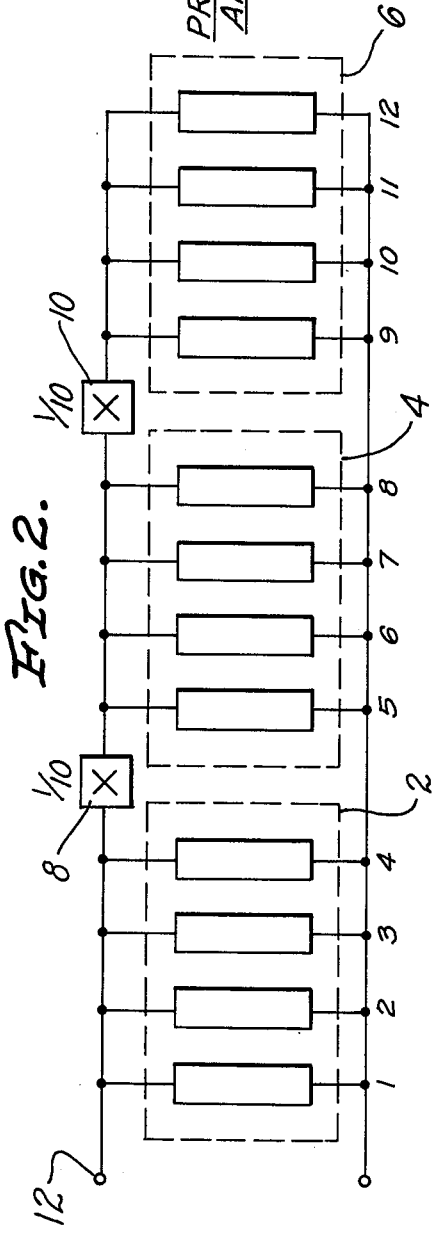

| BIT # | 1 | 2 | 3 | 4 | 5 | 6 | 7 | 8 | 9 | 10 | 11 | 12 | FULL SCALE I |
|---|---|---|---|---|---|---|---|---|---|---|---|---|---|
| BINARY I (μ) | 1,000 | 500 | 250 | 125 | 62.5 | 31.25 | 15.62 | 7.81 | 3.91 | 1.95 | 0.98 | 0.49 | 1,999.5 |
| UNADJUSTED BCD I | 1,000 | 500 | 250 | 125 | 125 | 50 | 25 | 12.5 | 10 | 5 | 2.5 | 1.25 | 1,248.8 |
| ADJUSTED BCD I | 1,600 | 800 | 400 | 200 | 160 | 80 | 40 | 20 | 16 | 8 | 4 | 2 | 1,998.0 |

DIGITAL TO ANALOG CONVERTER WITH BINARY AND BINARY CODED DECIMAL MODES

BACKGROUND OF THE INVENTION

A. Field of the Invention

This invention relates to electronic circuits, and more particularly to digital to analog converters having alternate binary and binary code decimal (BCD) modes of operation.

B. Description of the Prior Art

BCD is a logic coding format having less stringent linearity requirements for digital to analog converters than binary coding. Depending upon the requirements of the particular application, a digital to analog converter (DAC) may be constructed to operate in either a binary or a BCD mode. The two coding systems are illustrated in FIG. 1. With binary coding each digit or bit has double the value of the preceding bit. The binary coding for the no. 729, occupying 10 bits, is shown as an example. BCD coding, on the other hand, is a combination of the binary and decimal systems. The code is arranged in groups of four bits, or quads, with the four bits in each successive quad providing a binary code representation of successively higher order decimal numbers. For example, the first four bits (reading from left to right) represent the numbers 0 through 9 multiplied by 100, the second four bits represent 0 through 9 multiplied by 10, and the third four bits represent 0 through 9. Thus, 12 bits grouped into three quads are necessary to form the numbers 0 through 999, with the BCD code for the number 729 given for purposes of illustration. Since the largest decimal number for any one quad is a decimal multiple of 9, maximum or full-scale output is attained when the first and fourth bits of the quad are on; it is not permissible to have all of the bits on at the same time for BCD.

Prior art DAC's capable of BCD operation generally follow the design pattern shown in FIG. 2, with three essentially independent DAC's 2, 4 and 6 (shown enclosed in dashed lines). Each quad consists of four bit circuits for a total of 12 bits numbered 1 through 12 for the three decimal number device shown in FIG. 2. Quads 2, 4 and 6 produce output currents representing the numbers 0 through 9 multiplied by a factor of 100 for quad 2, a factor of 10 for quad 4, and a factor of 1 for quad 6. Since the input currents for corresponding bits of the various quads are equal, proper BCD scaling between quads is achieved by using high input currents for each quad and then attenuating the outputs of quads 4 and 6. For this purpose current dividers 8 and 10 are connected between the output lines for quads 2 and 4, and quads 4 and 6 respectively. Output current is drawn from an output terminal 12 into each of the bits, the output for quad 4 being attenuated by a factor of 10 and the output of quad 6 by a factor of 100. With this design most of the current drawn by quads 4 and 6 is wasted, with relatively little of the current appearing at the output. This situation is summarized in FIG. 3, which gives the input current drawn by each bit (in microamperes) and the ultimate output current resulting from each bit. With the first and fourth bits of each quad operating to produce a full-scale output current of 999 microamperes, a total of 2700 microamperes are actually drawn through the individual bits. The difference between these two current levels represents a substantial loss of power in the conversion from binary to BCD operation.

In addition to the power loss, the prior art approach described above involves some further disadvantages. Forcing the bit circuits to be grouped into quads involves a loss of design flexibility, while the use of resistance current dividers to attenuate the output current between quads can produce errors in the relative current weighting assigned to each of the quads. Also, the output terminal must be held at virtual ground to maintain precision attenuation between quads and thus exhibits poor compliance, i.e., an ability to operate over a significant voltage range while maintaining accuracy.

Another problem involves the output voltage level. DAC's are typically employed in a circuit as shown in FIG. 4, with the output of the DAC 14 connected to the positive input of an external operational amplifier 16 for a current to voltage conversion which produces an output voltage signal at output terminal 18. The conversion ratio is controlled by a span resistor 20 connected between the output and positive input of amplifier 16. In the past this configuration has led to a problem in converting from binary to BCD operation due to an industry convention calling for a fixed full-scale voltage (usually 10 volts) at terminal 18, regardless of the DAC mode. Since the binary mode full-scale current output is greater than the BCD full-scale current output by a factor of 1.6, the output voltage at terminal 18 is greater for binary operation than for BCD unless some compensating adjustment is made to the system. In the prior art this adjustment is made by changing the resistance value of span resistor 20 when the full-scale current output is changed. It is desirable and economically efficient for this adjustment to be made at final test after the DAC has been completely manufactured so that devices meeting the stringent linearity requirements can be assigned to binary usage, with the remainder going to BCD. However, since span resistor 20 is generally formed directly on the chip for integrated circuits, it cannot be adjusted to a BCD value at final test with the same precision that it could have originally been built to. As a result this method of binary to BCD conversion introduces the possibility of undesirable errors in the magnitude of the output voltage signal.

SUMMARY OF THE INVENTION

In view of the above problems found in the prior art, it is the object of this invention to provide a novel DAC having improved binary to BCD conversion capabilities. Related objects include the provision of a DAC in which a binary to BCD conversion may be made conveniently after manufacture of the device has been completed without sacrificing accuracy, with a capability of grouping individual bit circuits identically for both binary and BCD coding to eliminate the need for grouping in quads and providing a more efficient use of power by eliminating the current attenuation between quads. Another object is the provision of such a DAC in which the bit circuit output currents are adjusted automatically in converting from binary to BCD mode operation so that the full-scale output currents for both modes are substantially equal, without the necessity for adjusting a span resistor and the inaccuracies which may accompany such an adjustment.

In the realization of these and other objects, the present invention provides a DAC having a plurality of bit circuits arranged in a progressive binary order, and associated bias circuitry. Means are provided to convert from binary to BCD mode operation by selectively increasing the output current of certain bits to a BCD level. To accomplish this conversion, each bit circuit includes a primary transistor means adapted for binary mode operation, while selected bit circuits also include a supplemental transistor means adapted to produce a supplemental output current which, together with the output current from the primary transistor means, attains a BCD current level for said bits. Means are included for switching the supplemental transistor means off during binary mode operation and on during BCD mode operation.

In a preferred embodiment at least some of the primary and supplemental transistor means in the higher than first order bit circuits comprise a multiple emitter transistor having one emitter connected to provide a primary binary output current, and another emitter connected to provide a supplemental BCD output current. The bias circuit comprises the combination of a bias line for the bit circuit transistors, BCD and binary NPN transistors connected in circuit respectively with BCD and binary bias resistors, and means such as an amplifier circuit for applying a reference current through the bias transistors and resistors to establish appropriate bias voltages for the bias line. In this embodiment the supplemental transistor means include NPN transistor devices having their emitters connected in circuit with the emitter of the BCD bias transistor for switching in tandem with said transistor. The binary to BCD conversion is controlled by an actuating means which is selectable to supply a cutoff voltage signal either to the emitters of the supplemental and BCD bias transistors, or to the emitter of the binary bias transistor. The cutoff voltage is preferably routed to one or the other of the bias transistors by means of a differential switch which receives an external mode control signal.

The conversion arrangement of this invention permits a more flexible design for the DAC, such as a resistance ladder divided into master and slave portions, with each portion being allocated a number of bit circuits which are an uneven multiple of four. The DAC also includes internal means actuable in conjunction with the binary to BCD conversion scheme for equalizing the full-scale binary and BCD output currents. The BCD output currents from each bit circuit are multiplied by a common amplification factor to BCD levels sufficient to substantially attain the desired equalization. In the described preferred embodiment this is accomplished by the use of current sources to increase the supplemental transistor current directed through the BCD bias resistor. This increases the BCD bias voltage on the bit circuits to a level at which the full-scale binary and BCD output currents are substantially equal.

DESCRIPTION OF THE DRAWINGS

Further advantages and features of the invention will be apparent to those skilled in the art from the ensuing detailed description thereof, taken together with the accompanying drawings in which:

FIGS. 1 through 4 illustrate the state of the prior art as described above;

FIG. 5 is a circuit diagram of a preferred embodiment of the invention; and

FIG. 6 is a chart of the bit circuit current flows under various modes of operation.

DESCRIPTION OF A PREFERRED EMBODIMENT

The integrated circuit DAC of FIG. 5 provides a solution to the prior art problems described above. The circuit is designed in the usual resistance ladder format with NPN transistors, but is divided into master and slave portions 22 and 24. This type of arrangement, with the exception of circuitry enabling binary to BCD conversion to be described hereinafter, is essentially similar to the 8 bit DAC circuit described in copending patent application Ser. No. 642,770, entitled "Multistage Electrical Ladder for Decrementing a Signal into a Plurality of Weighted Signals," filed Dec. 22, 1975 and assigned to the assignee of the present invention, the contents of which are hereby incorporated by reference. The ladder network forms twelve bit circuits comprising transistors Q1–Q12. For discussion purposes the bit circuits or "bits" may be grouped in "quads" of four bits each, the first quad comprising transistors Q1–Q4, the second quad transistors Q5–Q8, and the third quad transistors Q9–Q12. The "quads" herein are functional groupings only; the ladder is not physically divided into groups of four bits, as was the case with prior designs. The first quad is situated on the master portion of the ladder and the third quad on the slave portion, while the second quad has its first two bits on the master portion and its second two bits on the slave portion. Each of the bit circuits also includes appropriate ladder resistances. Switches 26 are interposed between the bits and an output terminal 28, the operation of the switches being controlled in response to an input digital signal such that terminal 28 is connected to a combination of bits which reconstructs the input signal in analog form. The bases of each of the master ladder transistors are connected to a master bias line 29, which line is carried over to the slave ladder as bias line 30. Bias line 29 is terminated by a remainder transistor Q13 which supports a current equal to the current of least significant master bit Q6. The remainder current is divided proportionately among bits 7–12.

Each of the bit transistors has a primary emitter, shown as the right-hand emitter in the accompanying figure, which is employed in both binary and BCD operation. The primary emitters on the slave ladder are connected such that their currents are summed and passed through Q13 as the remainder signal. In addition, each of the bits on the higher than first order quads, i.e., bits 5–12, is provided with a supplemental transistor means which adds to its output current during BCD operation by an amount sufficient to bring the current level for all of the bits to a BCD relationship. For each of slave ladder transistors Q7–Q12, the supplemental transistor means takes the form of an additional emitter connected through the master ladder at a location other than remainder transistor Q13. The supplemental transistor means for bits 5 and 6 on the master ladder comprise separate transistors Q14 and Q15 on the slave ladder having their collectors connected to the collectors of Q5 and Q6, respectively. The supplemental transistor devices for the second quad and for the third quad are connected respectively through transistor switches Q16 and Q17 on the master ladder to the bias circuit described below.

An input bias reference signal may be provided for the DAC by an operational amplifier 31 connected to a reference voltage $V_R$ to supply a reference current $I_R$ to a double emitter NPN bias transistor Q18. One of the emitters of Q18 is connected to a first bias resistor 32 to provide a binary mode bias level, while the other emitter is connected to a second bias resistor 34 to provide a BCD mode bias level. Selection of the operating mode is controlled by a circuit which includes a differential switch 36 having a pair of branches formed by PNP transistors Q19 and Q20. The base of Q19 is held at a constant bias voltage $V_B$, while the base of Q20 is connected through an emitter follower buffer transistor Q21 to a zener diode 40. The zener 40 is also connected to contact pads 38 and 42 which may be contacted by a voltage probe after the device has been manufactured, should BCD operation be desired. This arrangement permits the application of an over-voltage exceeding the reverse bias breakdown voltage of zener 40 to cause a permanent short circuit through the zener between pads 38 and 42. In this event, a positive signal will be applied to the base of Q20, turning that transistor off and placing Q19 in a conductive mode. In the absence of an induced short through zener 40, the voltage at the base of Q20 will be less than the voltage at the base of Q19, causing Q20 to be actuated while Q19 is nonconductive.

Differential switch 36 transmits to the bias circuit a current set up by a circuit consisting of transistor Q22 on the master ladder, and a diode connected transistor Q23 which connects Q22 to a positive voltage source. The current through Q23 is mirrored by transistor Q24 for delivery to the switch. The collector of Q19 is connected to the binary emitter of bias transistor Q18, while the collector of Q20 is connected to the BCD emitter of that transistor. Whichever branch of the differential switch is conducting causes a current to be passed through its associated bias resistor 32 or 34. This current increases the voltage of whichever emitter of Q18 is connected to the conducting resistor to a level greater than the base voltage of Q18, thereby cutting off that emitter and causing the other emitter of Q18 to conduct. Cutting off the BCD emitter connected to resistor 34 also disables supplemental current devices Q16 and Q17 by increasing their respective emitter voltages, thereby preventing any supplemental current from flowing.

Whichever emitter of Q18 is conducting receives reference current $I_R$, preferably ½ milliamp, and transmits it through its associated bias resistor to establish a bias voltage across the resistor which is reflected back to the base of Q18 to establish a ladder bias voltage. In the binary mode the ½ milliamp reference current is passed through bias resistor 32, producing a 4-volt ladder bias. In the BCD mode, however, the currents from the supplemental transistor devices on the slave ladder are added to the reference current before it passes through bias resistor 34. This increases the voltage drop across bias resistor 34 and accordingly increases the ladder bias voltage, which in turn increases the output current from each of the bits. By an appropriate selection and arrangement of the circuit elements, the additional bias current during BCD mode operation is made great enough to increase the ladder bias voltage to a level at which the full-scale BCD output current substantially equals the full-scale binary output current. To achieve this result, a current source transistor Q25 is added to the master ladder with its emitter tied to the emitters of BCD supplemental transistors Q16 and Q17, and a double emitter current source transistor Q26 is added to the slave ladder with its two emitters connected to add to the supplemental output current of the second and third quads respectively. A voltage source $V_S$ is connected to the collectors of both current source transistors so that they produce a current which, when added to the BCD supplemental output current of bits 5–12, is sufficient to bring the total full-scale supplemental current routed through bias resistor 34 to 300 microamperes. This increases the BCD bias voltage by a factor of 1.6 over the binary bias voltage, which increase is sufficient to substantially equalize the full-scale output current levels for the binary and BCD modes. Since only the first and fourth bits of each quad are on during full-scale BCD operation, the currents transmitted by Q25 and Q26 are based only on those bits, rather than on the total of all the individual bit currents.

Current flows through the various circuit elements for binary mode operation are indicated in FIG. 5, with BCD mode current flows shown in parentheses. Only BCD flows are given for those elements which support a zero binary flow. The current flow situation for each of the twelve bits is summarized in FIG. 6. The first line indicates the current for each bit during binary mode operation, with a full-scale current of 1,999.5 microamperes. The second line shows what the total primary and supplemental current flows would be for each bit in a BCD mode without adjusting the bias level from the binary bias. With the first and fourth bits of each quad conducting, full-scale output current is 1,248.8 microamperes. It will be noted that in the conversion from binary to BCD the current carried by each bit in the first order quad is unchanged from the binary level, while the current for each bit in the second quad is amplified by a factor of 1.6. In the third quad the amplification is compounded by another factor of 1.6, resulting in BCD bit currents for the third quad which exceed the binary levels by a factor of 2.56. The third line of FIG. 6 gives the BCD current flows after further amplification by the bias adjustment mechanism. The flow through each bit is multiplied by a factor of 1.6 from the level of the second line, resulting in a 1,998 microampere full-scale current flow which substantially equals the full-scale binary flow.

A particular embodiment of a DAC capable of conveniently and efficiently converting from binary to BCD operation, with an automatic adjustment of the full-scale BCD current flow, has thus been shown and described. Since numerous modifications and variations of its particular features are possible within the teachings of the invention, it is intended that the scope of the invention be limited only in and by the terms of the appended claims.

What is claimed is:

1. A digital to analog converter (DAC) adapted to receive digital input signals and to produce an output analog signal corresponding to the digital input, said converter comprising a plurality of bit circuits arranged in progressive binary order, bias circuitry for said bit circuits, and means for converting from a binary to a BCD input mode, said converting means comprising, for each of a plurality of selected bit circuits, a selectable area-scaled transistor means internal to said DAC for increasing to a BCD level the individual output current of said selected bit circuits.

2. The DAC of claim 1, wherein each bit circuit includes a primary transistor means adapted for binary mode operation, each selected bit circuit includes a supplemental transistor means adapted to produce a supplemental output current which, together with the output current from the primary transistor means for said bit, is at a BCD level, and said bias circuitry provides a common bias for said primary and supplemental transistor means in the BCD mode, and further including means for switching each of said supplemental transistor means on or off for operation in BCD and binary modes respectively.

3. The DAC of claim 2, wherein the primary and supplemental transistor means for at least some of said selected bit circuits comprise a multiple emitter transistor having one emitter connected to provide a primary binary output current, and another emitter connected to provide a supplemental BCD output current.

4. The DAC of claim 2, said switching means comprising first means for actuating said primary transistor means, second means for actuating both said primary and supplemental transistor means, and means for switching between said first and second actuating means.

5. The DAC of claim 4, said first actuating means comprising a first bias circuit adapted to provide a reference bias current for said primary transistor means, said second actuating means comprising a second bias circuit adapted to provide a common reference bias current for the combination of said primary and supplemental transistor means, said second bias circuit being connected in circuit with said supplemental transistor means to enable the flow of supplemental output current under the control of said second actuating means.

6. The DAC of claim 1, wherein said bit circuits are arranged in functional groupings of four bit quads, said selected bit circuits comprising the bit circuits in the higher than first order quads.

7. The DAC of claim 6, said current increasing means comprising means to increase the output current of the bit circuits in each of said higher order quads by a compound factor of substantially 1.6 for each successive quad.

8. In a DAC arrangement having a plurality of bit circuits arranged in progressive binary order, bias circuitry for said bit circuits, and means for converting said DAC from a binary to a BCD mode, the improvement comprising means for substantially equalizing the full-scale binary mode output current with the full-scale BCD mode output current, said equalizing means comprising selectable means internal to said DAC and actuable in conjunction with said conversion means for amplifying, by a common amplification factor, the magnitudes of the BCD output currents for each bit circuit to amplified BCD levels sufficient to substantially equalize the full-scale binary mode and BCD mode output currents.

9. The DAC of claim 8, each of said bit circuits including transistor means controlling their output currents, wherein said current amplifying means comprises means for adjusting the bias signal for said bit transistor means.

10. The DAC of claim 9, said bias circuitry including a binary mode bias circuit, a BCD mode bias circuit, and switch means for selectively enabling one and disabling the other of said bias circuits.

11. The DAC of claim 10, wherein each bit circuit includes a primary transistor means adapted for binary mode operation, selected higher than first order bit circuits each include a supplemental transistor means adapted to produce a supplemental bit circuit output current sufficient to bring the total bit circuit output current to a BCD level, said binary and BCD bias circuits each include reference current means adapted to direct a reference current through respective bias resistance means and thereby produce respective bias voltages, and said supplemental transistor means are connected for their currents to add to the BCD reference current and thereby increase the bias voltage during BCD mode operation.

12. The DAC of claim 11, and further including current source means connected in circuit with said supplemental transistor means to add to the current directed through said BCD bias resistor, the magnitude of the current produced by said current source means being sufficient to increase the BCD bias voltage to a level at which the full-scale binary and BCD output current levels are substantially equal.

13. A DAC comprising a plurality of bit circuits arranged in progressive binary order, bias circuit means for said bit circuits, a plurality of selectable transistor means internal to said DAC and actuable to increase the output current of selected higher than first order bit circuits to a BCD level, and means internal to said DAC and actuable in conjunction with actuation of said selectable transistor means for amplifying, by a common amplification factor, the magnitudes of the BCD output currents for each bit circuit to amplified BCD levels sufficient to equalize the full-scale binary mode and BCD mode output currents.

14. The DAC of claim 13, each bit circuit including a primary transistor means adapted to produce a binary mode output current, the selectable transistor means for each selected bit circuit comprising a supplemental transistor means actuable to produce a supplemental output current sufficient to increase the total output current for its respective bit circuit to a BCD level, and further including switch means for actuating and deactuating each of said supplemental transistor means during BCD and binary mode operation, respectively.

15. The DAC of claim 14, said bias circuit means comprising a binary bias portion for said primary transistor means, a BCD bias portion for said primary and supplemental transistor means, and means for selectably enabling one of said bias circuit portions and disabling the other, said supplemental BCD transistor means being connected in circuit with said bias circuit means for actuation when said BCD bias portion is enabled.

16. The DAC of claim 15, said binary and BCD bias circuit portions including means for directing reference currents through binary and BCD bias resistors to establish respective bias voltages, said supplemental BCD transistor means being connected to add to the reference current applied through said BCD bias resistor.

17. The DAC of claim 16, said amplifying means comprising a current source means adapted to add to the supplemental transistor current directed through said BCD bias resistor, the magnitude of the current produced by said current source means being sufficient to increase the BCD bias voltage to a level at which the full-scale binary and BCD output current levels are substantially equal.

18. A digital to analog converter comprising a plurality of bit circuits arranged in a resistance ladder of progressive binary order and functionally grouped into four-bit quads, each bit circuit including a primary transistor means adapted to draw a predetermined amount of output current when its associated bit circuit is actuated, a transistor bias circuit for said bit circuits, and means for selecting between binary and BCD operation modes, said means comprising:

for each transistor means of each bit circuit in the higher than first order quads, an associated area-scaled supplemental transistor means internal to said DAC, each of said supplemental transistor means being actuable to draw a supplemental output current of sufficient magnitude to establish a BCD relationship between the total of the primary and supplemental output currents of said bit circuits, and selectable means for actuating said supplemental transistor means.

19. The DAC of claim 18, wherein said bias circuit comprises the combination of a bias line for the transistors of said bit circuits, BCD and binary NPN transistor means connected in circuit respectively with BCD and binary bias resistors to establish a bias voltage for said bias line as determined by the currents through said resistors, and means for applying bias current through said bias transistors and resistors, each supplemental transistor means comprises an NPN transistor means having its emitter connected in circuit with the emitter of one of said bias transistor means, and said selectable actuating means comprises means for selectably applying a cutoff voltage signal to the emitters of either said supplemental and said one bias transistor means, or to the emitter of the other bias transistor means.

20. The DAC of claim 19, said means for applying a cutoff voltage signal comprising the combination of a differential switch having a first branch connected to the emitters of said supplemental and said BCD bias transistor means, a second branch connected to the emitter of said binary bias transistor means, means for transmitting a switching signal to one of said branches, and a cutoff voltage source connected in circuit with said differential switch for transmission to said bias circuit.

21. The DAC of claim 20, said means for transmitting a switching signal comprising a zener diode connected in circuit with the first branch of said differential switch, and means for transmitting an over-voltage to cause permanent short circuiting of said diode.

22. The DAC of claim 19, and further including current source means connected in circuit with said supplemental transistor means for directing an additional current through said BCD bias resistor, the magnitude of said additional current being sufficient to increase the bias line voltage during BCD mode operation to a level at which the BCD full-scale output current is substantially equal to the binary full-scale output current.

23. The DAC of claim 18, each of said bit circuit transistor means comprising NPN transistors, and at least some of said supplemental transistor means comprising second emitters on the primary transistor for their respective bit circuits.

24. The DAC of claim 18, said resistance ladder being divided into a master ladder portion having a terminating means for generating a remainder signal, and a slave ladder portion dividing said remainder signal among the primary transistor means of the slave portion bit circuits, the number of bit circuits allocated to said master and slave portions each being an uneven multiple of four.

25. The DAC of claim 24, each of said supplemental transistor means being located in the slave ladder portion, and further including transistor switch means in the master ladder portion connected in circuit with said supplemental transistor means, and means for disabling said transistor switch means during binary mode operation so as to prevent supplemental current flow.

26. The DAC of claim 25, said bias circuit including first and second NPN transistor means connected respectively in circuit with first and second bias resistors to provide binary and BCD bias voltages, and selectable means for controlling the bias mode of said bias ladder by applying a cutoff voltage signal to the emitter of a desired one of said bias transistors, said transistor switch means comprising an NPN transistor means having an emitter connected in circuit with the emitter of said BCD bias transistor so that a cutoff signal applied to said BCD bias transistor also cuts off said switching transistor.

27. The DAC of claim 25, said transistor switch means comprising individual transistors connected in circuit respectively with each quad of supplemental transistor means, the emitters of said supplemental and switching transistors being area-scaled to increase the output current levels for the higher than first order quads to a BCD level.

* * * * *